United States Patent
Li et al.

(10) Patent No.: US 9,899,987 B2
(45) Date of Patent: Feb. 20, 2018

(54) ACTIVE TYPE TEMPERATURE COMPENSATION RESONATOR STRUCTURE

(71) Applicant: National Tsing Hua University, Hsinchu (TW)

(72) Inventors: Sheng-Shian Li, Hsinchu (TW); Ming-Huang Li, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 604 days.

(21) Appl. No.: 14/560,316

(22) Filed: Dec. 4, 2014

(65) Prior Publication Data
US 2015/0326199 A1    Nov. 12, 2015

(30) Foreign Application Priority Data
May 7, 2014 (TW) .............................. 103116202 A

(51) Int. Cl.
| H01L 41/04 | (2006.01) |
| H03H 9/02 | (2006.01) |
| H03H 9/24 | (2006.01) |

(52) U.S. Cl.
CPC ....... H03H 9/02448 (2013.01); H03H 9/2473 (2013.01); H03H 2009/2442 (2013.01)

(58) Field of Classification Search
CPC .................................................. H03H 9/02448
USPC ........................................ 310/315, 343, 346
See application file for complete search history.

(56) References Cited

U.S. PATENT DOCUMENTS

| 8,232,707 | B2 * | 7/2012 | Furuhata | ............ H03H 9/02102 310/346 |
| 9,240,767 | B2 * | 1/2016 | Burgess | ............ H03H 9/02102 |
| 2005/0150297 | A1 * | 7/2005 | Ayazi | ................ G01C 19/5719 73/504.16 |
| 2010/0154553 | A1 * | 6/2010 | Phan Le | ............... G01L 9/0022 73/727 |
| 2012/0038431 | A1 * | 2/2012 | Jaakkola | ............. H03H 3/0072 331/155 |

(Continued)

FOREIGN PATENT DOCUMENTS

| ES | 2187281 A1 * | 5/2003 | ............... H03L 1/02 |
| JP | 03048714 A * | 3/1991 | ............. G01C 19/56 |
| WO | 2011/064405 A1 | 6/2011 | |

*Primary Examiner* — Thomas Dougherty
(74) *Attorney, Agent, or Firm* — Mintz Levin Cohn Ferris Glovsky and Popeo, P.C.; Peter F. Corless; Steven M. Jensen

(57) ABSTRACT

An active type temperature compensation resonator structure is provided, including a resonant body and a temperature compensation element embedded in the resonant body for a compensation current to pass therethrough. The temperature compensation element has a specified temperature coefficient of resistance that reflects the temperature of the resonant body. The magnitude of the compensated current corresponds to the reflected temperature of the resonant body. With the active type temperature compensation resonator structure, the temperature of the resonant body can be accurately reacted by the specified temperature coefficient of resistance, such that the temperature compensation element, through which the compensated current passes, can dynamically correspond to the temperature of the resonant body and accurately provide the resonant body with temperature compensation.

9 Claims, 6 Drawing Sheets

(56) References Cited

U.S. PATENT DOCUMENTS

2012/0305542 A1 12/2012 Donnay et al.
2015/0021734 A1* 1/2015 Kautzsch .......... H01L 21/76202
                                                    257/506

* cited by examiner

ACTIVE TYPE TEMPERATURE COMPENSATION RESONATOR STRUCTURE

CROSS-REFERENCES TO RELATED APPLICATIONS

This application claims under 35 U.S.C. § 119(a) the benefit of Taiwanese Application No. 103116202, filed May 7, 2014, the entire contents of which is incorporated herein by reference.

BACKGROUND OF THE INVENTION

1. Field of the Invention

The present invention relates to resonators, and, more particularly, to a resonator structure having a temperature compensation element embedded therein.

2. Description of Related Art

In the field of resonator of microelectronics, pulse elements and resonators are fundamental elements and are variously applied. In particular, a mechanical resonant body with a high Q value is almost a necessary element in all wireless communication, signal processing and electronic circuit systems. However, the resonant frequency of the resonant body drifts with the temperature of the resonant body, such that it is an important issue to maintain the temperature of the resonant body in a suitable interval for reducing the defect of frequency drifting.

According to WO 2011/064405A1 and US 2012/0305542A1, as shown in FIG. 5 and corresponding description in the specification of the aforementioned prior art, an outer wall of a resonant body (element 11) further comprises a temperature compensation element (elements 61 and 62). In the prior arts, the temperature of the resonant body is reflected by the temperature compensation element disposed on the outer wall of the resonant body to perform temperature compensation, such that the temperature of the resonant body maintains in a suitable temperature interval.

However, the temperature compensation technique shown in the aforesaid prior arts still needs to be improved. Specifically, since the temperature compensation element of the prior arts is disposed on the outer wall of the resonant body, and an insulating pad is further provided between the temperature compensation element and the resonant body, the temperature compensation unit cannot accurately reflect the temperature of the resonant body and may produce an error of temperature determination. On this basis, the temperature compensation cannot be accurately performed to the resonant body. This defect is especially obvious in a highly sophisticated electronic product.

Accordingly, it is an important issue in the industry to provide a resonator structure that can precisely reflect the temperature of the resonant body to perform accurate temperature compensation to the resonant body.

SUMMARY OF THE INVENTION

Given the defects of the prior arts, the present invention provides a resonator structure that can accurately reflect the temperature of the resonant body.

In order to achieve the above objectives and other objectives, the present invention provides an active type temperature compensation resonator structure, comprising a resonant body and a temperature compensation element. The temperature compensation element is embedded in the resonant body for a compensated current to pass therethrough, and has a specified temperature coefficient of resistance to reflect temperature of the resonant body. The magnitude of the compensated current corresponds to the reflected temperature of the resonant body.

In an embodiment, the temperature compensation element further comprises a temperature sensing unit and a temperature controlling unit. The temperature compensation element enables an external measurement control circuit to determine and reflect the temperature of the resonant body according to the specified temperature coefficient of resistance. The compensated current passes through the temperature controlling unit. Moreover, the measurement control circuit automatically adjusts the magnitude of the compensated current when it is determined that the temperature of the resonant body meets a predetermined temperature control condition.

Compared with the prior arts, the temperature compensation element of the present invention is directly embedded in the resonant body, so as to accurately reflect the temperature of the resonant body through a specified temperature coefficient of resistance. Further, since the compensated current of the temperature compensation element can dynamically correspond to the temperature of the resonant body, the temperature compensation can be accurately provided to the resonant body.

BRIEF DESCRIPTIONS OF THE DRAWINGS

DETAILED DESCRIPTION OF THE PREFERRED EMBODIMENTS

In the following, specific embodiments are provided to illustrate the detailed description of the present invention. Those skilled in the art can easily conceive the other advantages and effects of the present invention, based on the disclosure of the specification. The present invention can also be carried out or applied by other different embodiments. Each of the details in the specification of the present invention can also be modified or altered in view of different viewpoints and applications, without departing from the spirit of the creation of the present invention.

The structures, proportions, and sizes illustrated in the appended drawings of the specification of the present invention are merely for coping with the disclosure of the specification, in order to allow those skilled in the art to conceive and peruse it. The drawings are not for constraining the limitations of the present invention, such that they do not have any technical significance. Any structural modifications, alterations of proportions and adjustments of sizes, as long as not affecting the effect brought about by the present invention and the purpose achieved by the present invention, should fall within the range encompassed by the technical content disclosed in the present invention. At the same time, the language used in the specification of the present invention is merely for the clarity of expression, and not intended to limit the scope of the present invention. The alterations or adjustments of the relative relationships, while not substantially altering the technical content, can also be regarded as fallen within the scope of the present invention.

Figure 1:
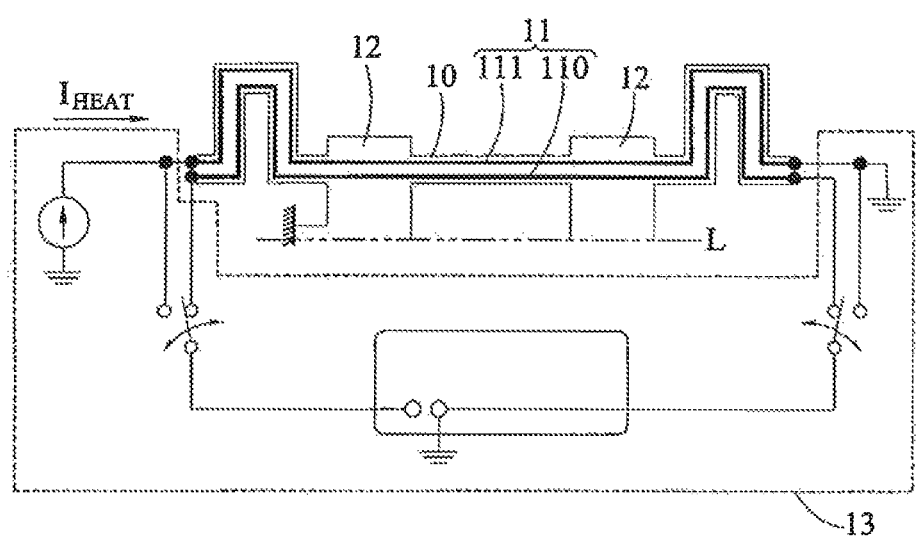
FIG. 1 is a structural schematic diagram of an active type temperature compensation resonator structure according to the present invention.

Please first refer to the structural schematic diagram of FIG. 1, an active type temperature compensation resonator structure 1 is illustrated. The active type temperature compensation resonator structure 1 comprises a resonant body 10 and a temperature compensation element 11.

The temperature compensation element 11 is directly embedded in the resonant body 10 for a compensated current to pass therethrough, and has a specified temperature coefficient of resistance to reflect temperature of the resonant body 10. The magnitude of the compensated current corresponds to the reflected temperature of the resonant body 10.

In an embodiment, the temperature compensation element 11 can be designed to a double circuit layout with a temperature sensing unit 110 and a temperature controlling unit 111. The temperature sensing unit 110 is embedded in the resonant body 10, and enables an external measurement control circuit 13 to determine and reflect the temperature of the resonant body 10 according to the specified temperature coefficient of resistance. The temperature controlling unit 111 is also embedded in the resonant body 10, and the compensated current such as $I_{HEAT}$ shown in FIG. 1 can pass through the temperature controlling unit. The measurement control circuit 13 automatically adjusts the magnitude of the compensated current when it is determined that the temperature of the resonant body 10 meets a predetermined temperature control condition.

Specifically, if the specified temperature coefficient of resistance and the temperature of the resonant body 10 are positively correlated, the resistance of the temperature sensing unit 110 reduces when the temperature of the resonant body 10 reduces, and vice versa. In an embodiment, when the measurement control circuit 13 measures that the resistance of the temperature sensing unit 110 exceeds a predetermined value, the magnitude of the compensated current passing through the temperature controlling unit 111 can be further actively adjusted, such that the temperature of the resonant body 10 is maintained in an interval satisfying a standard. For example, when it is measured and determined that the temperature of the resonant body 10 is lower than the standard, the magnitude of the compensated current can be increased.

Alternatively, if the specified temperature coefficient of resistance and the temperature of the resonant body 10 are negatively correlated, the resistance of the temperature sensing unit 110 increases when the temperature of the resonant body 10 reduces, and vice versa. In an embodiment, when the measurement control circuit 13 measures that the resistance of the temperature sensing unit 110 exceeds a predetermined value, the magnitude of the compensated current passing through the temperature controlling unit 111 can be further actively adjusted, such that the temperature of the resonant body 10 is maintained in an interval satisfying a standard. For example, when it is measured and determined that the temperature of the resonant body 10 is lower than the standard, the magnitude of the compensated current can be increased.

From the above, the measurement control circuit 13 can actively adjust the magnitude of the compensated current when it is determined that the temperature of the resonant body 10 meets a predetermined temperature control condition. The illustrated circuit design of the measurement control circuit 13 is merely provided as an example, and the measurement control circuit 13 should not be limited by the illustration.

It should be appreciated that in an embodiment, the temperature compensation element 11 is not necessary to be designed to a type of separately having a temperature sensing unit 110 and a temperature controlling unit 111. That is to say, the illustrated temperature sensing unit 110 and temperature controlling unit 111 can be designed in a single circuit layer by altering a manufacturing process according to the actual needs, such that the temperature sensing and temperature controlling can be performed in a single circuit. In an embodiment, the resonant body 10 and the temperature compensation element 11 may have a wafer stack structure, and the resonant body 10 is made an electrically insulating material, such as $SiO_2$, $Si_3N_4$ or glass, and the like.

Figure 2A:
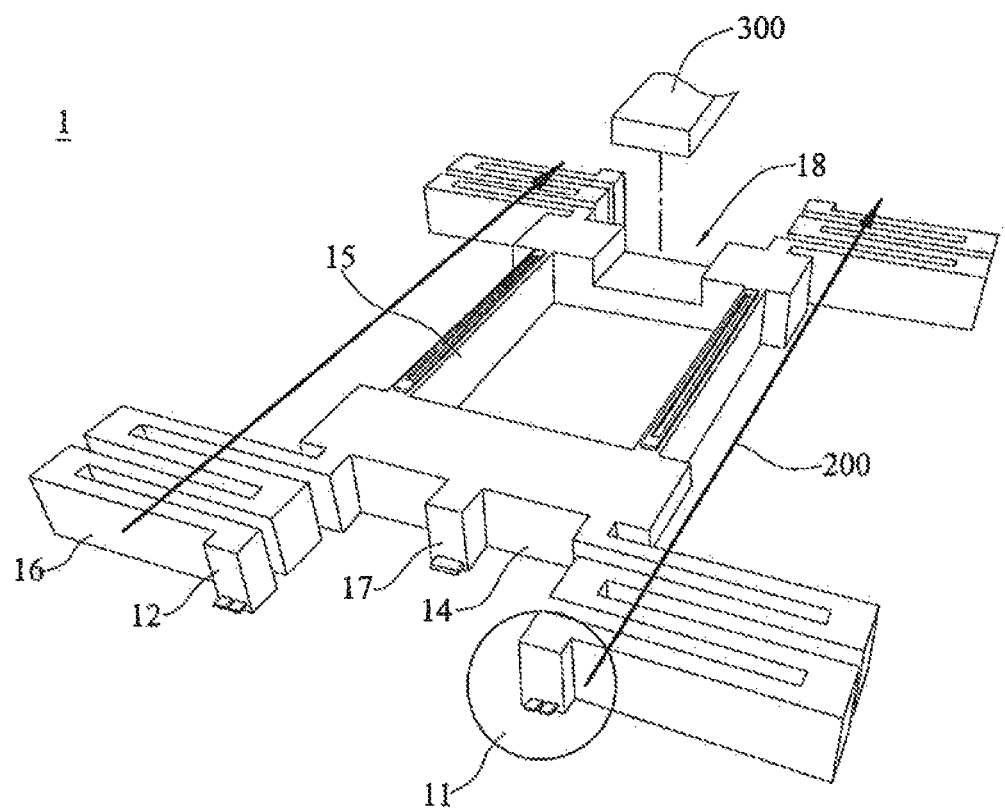
FIGS. 2A and 2B are schematic diagrams of an active type temperature compensation resonator structure according to the present invention designed in a shape of a tuning fork.

In an embodiment, the active type temperature compensation resonator structure 1 illustrated in FIG. 1 has a symmetric structure by a segment L, so as to from a structure of a double-ended tuning fork, as shown in FIG. 2A. In an embodiment of a resonant body 10 formed as a double-ended tuning fork, two ends of the resonant body 10 are further formed with anchor points 12, so as to anchor on a chip substrate material.

FIG. 2A illustrates an embodiment of the active type temperature compensation resonator structure 1, in which two ends of a tuning fork body 14 can be connected by two resonant beams 15, and a serpentine heater 16 may be extended from two sides of each tuning fork body 14. One end of the serpentine heater 16 is connected to the tuning fork body 14, and the other end of the serpentine heater 16 forms an anchor point 12 for external connection. Moreover, the temperature sensing unit 110 and the temperature controlling unit 111 shown in FIG. 1 are embedded in the serpentine heater 16, such that the resonant beam 15 forms the resonant body 10 shown in FIG. 1 and the anchor point 12 may connect the temperature compensated element 11 including the temperature sensing unit and temperature controlling unit. As such, the resonant beam 15 and the temperature sensing unit 110 and temperature controlling unit 111 embedded therein, as shown in FIG. 1, form the resonant body 10, and the serpentine heater 16 provides a heating current 200 from one tuning fork body 14 to another tuning fork body 14.

One of the tuning fork bodies 14 has a supporting tether 17 which provides a suitable anchoring function. The supporting tether 17 not only reduces thermal stress, but also maintains sufficient heat isolation for a heating operation in a low power. The entire heat isolation performance of the serpentine heater 16 can be manipulated by the supporting tether at the center of the tuning fork body 14, so as to provide huge thermal resistance of a material with low heat conductivity. The serpentine heater 16 is only an embodiment, and can have a variety of shapes.

Moreover, another one of the tuning fork bodies 14 has a heat isolation trench 18, and a driving electrode 300 is suspended on the heat isolation trench 18. A bridge structure runs across the tuning fork body 14, and the driving electrode 300 may be a metal material. The design of driving electrode 300 and heat isolation trench 18 enables the driving electrode 300 to connect and access a central electrode, without sacrificing the heat isolation performance.

Figure 2B:
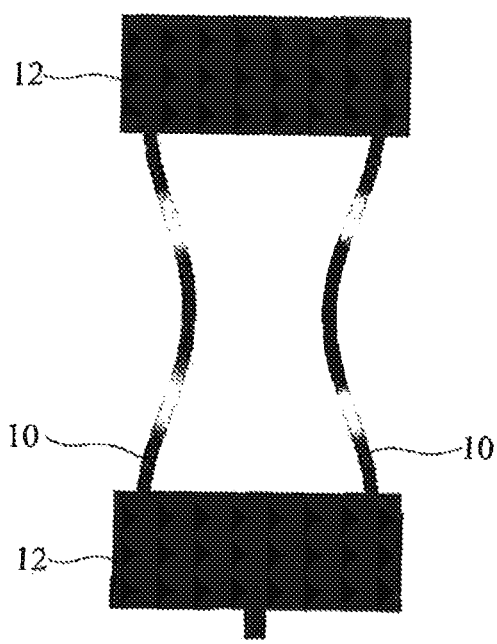

FIG. 2B illustrates the resonant body 10 of the active type temperature compensation resonator structure 1 with a shape designed as a double-ended tuning fork structure. The upper and lower ends may be anchor points 12 to connect with external heat source, and middle resonant body 10 achieves the effect of resonation.

Figure 3:
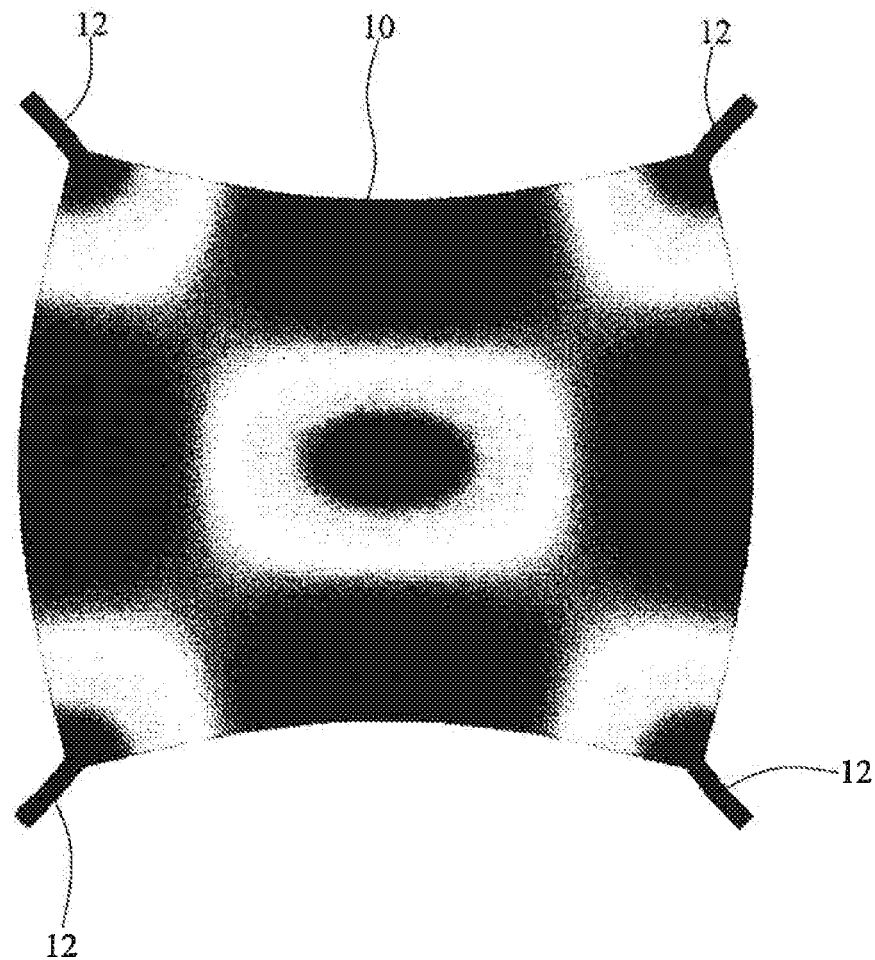
FIG. 3 is a schematic diagram of an active type temperature compensation resonator structure according to the present invention designed in a shape of a Lame mode.
Figure 4:
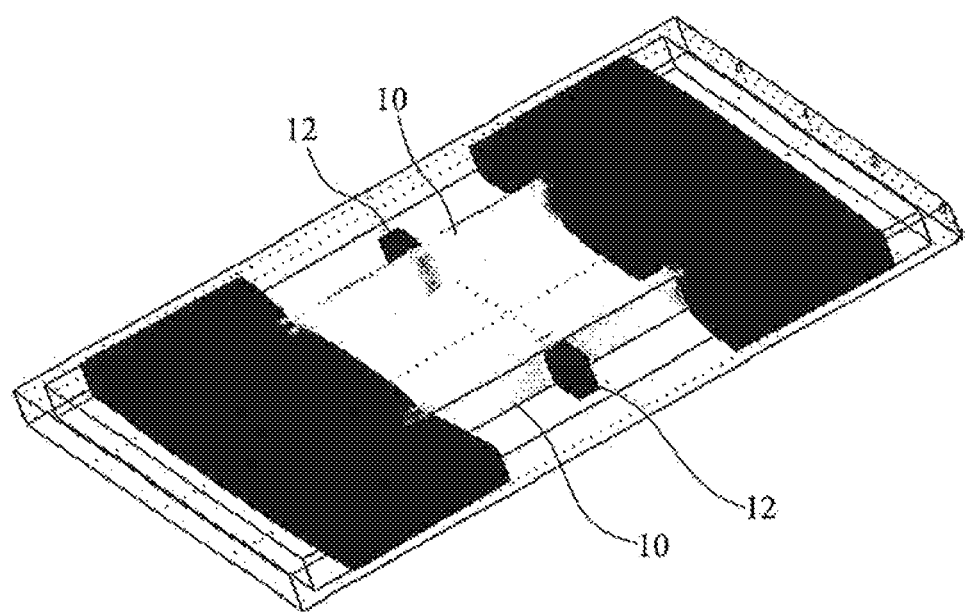
FIG. 4 is a schematic diagram of an active type temperature compensation resonator structure according to the present invention designed in a shape of an extensional bar.

The active type temperature compensation resonator structure according to the present invention is not limited to the double-ended tuning fork structure. As shown in FIG. 3, the resonant body 10 can be designed to be in a shape of a Lame mode, in which the resonant body 10 formed as the Lame mode may form anchor points 12 at ends of the resonant body 10. As shown in FIG. 4, the resonant body 10 can also be designed to be in a shape of an extensional bar, in which the resonant body 10 formed as the extensional bar may form anchor points at a middle region of the resonant body 10.

Figure 5:
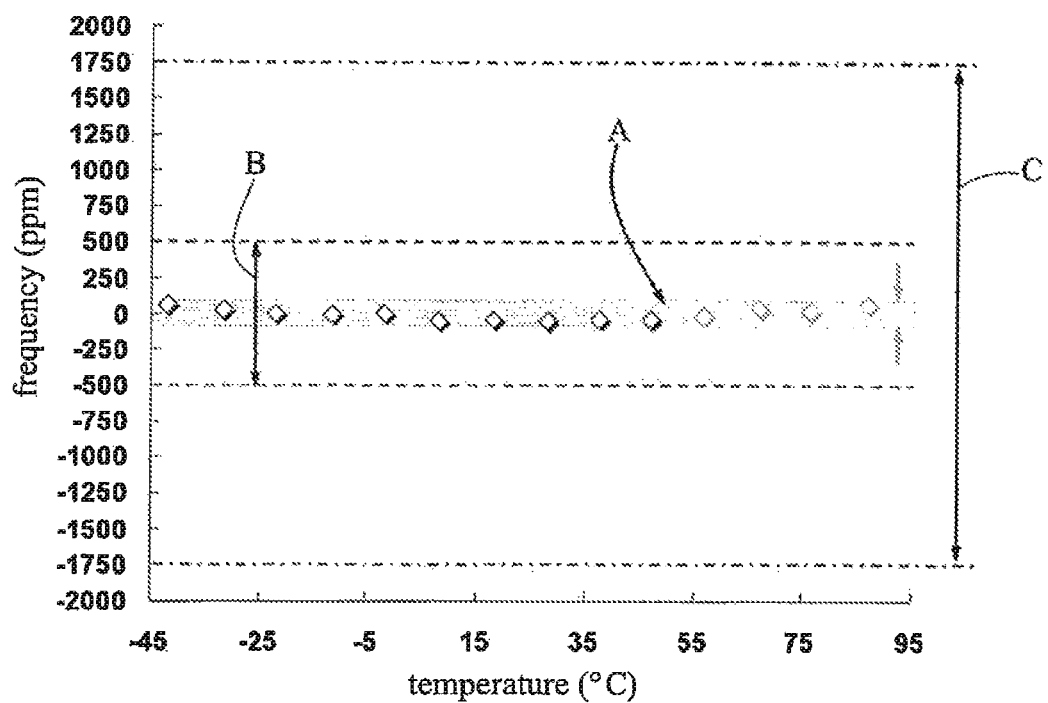
FIG. 5 is a comparison chart of an improvement of frequency drifting in a practical test of an embodiment of the present invention.

Referring to FIG. 5, a comparison chart of an improvement of frequency drifting in a practical test of an embodiment of the present invention is provided. As illustrated, interval A represents a range of frequency drifting of the structure design according to the present invention, and interval B represents a range of frequency drifting of the resonator of conventional passive compensation insulator structure such as CMOS-MEMS, and interval C represents a range of frequency drifting of a conventional non-compensated monocrystalline silicon resonator. It can clearly be seen that the structure design of the present invention can more precisely reflect the temperature of the resonant body to accurately perform temperature control of the resonant body. Thus, the temperature of the resonant body can be maintained in a suitable temperature interval, such that the frequency drifting of the resonator can be further significantly reduced.

As compared to the prior arts, the temperature compensation element of the present invention is directly embedded in the resonant body, so as to accurately reflect the temperature of the resonant body through a specified temperature coefficient of resistance. Further, since the compensated current of the temperature compensation element can dynamically correspond to the temperature of the resonant body, the temperature compensation can be further accurately provided to the resonant body, such that the temperature of the resonant body can be maintained in a suitable temperature interval, thereby significantly reducing the defects of frequency drifting.

The above examples are only used to illustrate the principle of the present invention and the effect thereof, and should not be construed as to limit the present invention. The above examples can all be modified and altered by those skilled in the art, without departing from the spirit and scope of the present invention as defined in the following appended claims.

What is claimed is:

1. An active type temperature compensation resonator structure, comprising:
   a resonant body; and
   a temperature compensation element embedded in the resonant body for a compensated current to pass therethrough, the temperature compensation element having a specified temperature coefficient of resistance to reflect temperature of the resonant body, wherein the compensated current has a magnitude corresponding to the reflected temperature of the resonant body,
   wherein the temperature compensation element comprises:
      a temperature sensing unit enabling an external measurement control circuit to determine and reflect the temperature of the resonant body according to the specified temperature coefficient of resistance; and
      a temperature controlling unit for the compensated current to pass therethrough, wherein the measurement control circuit automatically adjusts the magnitude of the compensated current when it is determined that the temperature of the resonant body meets a predetermined temperature control condition.

2. The active type temperature compensation resonator structure of claim 1, wherein the resonant body is in a shape of a tuning fork, a Lame mode, or an extensional bar.

3. The active type temperature compensation resonator structure of claim 2, wherein the resonant body is in the shape of the tuning fork and has anchor points at two ends of the resonator body.

4. The active type temperature compensation resonator structure of claim 2, wherein the resonant body is in the shape of the Lame mode and has anchor points at ends of the resonator body.

5. The active type temperature compensation resonator structure of claim 2, wherein the resonant body is in the shape of the extensional bar and has anchor points at a middle region of the resonator body.

6. The active type temperature compensation resonator structure of claim 1, wherein the resonant body is made of an electrically insulating material including $SiO_2$, $Si_3N_4$ and glass.

7. The active type temperature compensation resonator structure of claim 1, wherein the measurement control circuit reflects the temperature of the resonant body according to resistance determination of the temperature sensing unit.

8. The active type temperature compensation resonator structure of claim 1, wherein the specific temperature coefficient of resistance and the temperature of the resonant body are positively correlated or negatively correlated.

9. The active type temperature compensation resonator structure of claim 1, wherein the resonant body and the temperature compensation element have a wafer stack structure.

* * * * *